United States Patent
Tsuchiya et al.

(10) Patent No.: US 12,266,520 B2
(45) Date of Patent: Apr. 1, 2025

(54) METHOD FOR MANUFACTURING EPITAXIAL WAFER, SILICON-BASED SUBSTRATE FOR EPITAXIAL GROWTH, AND EPITAXIAL WAFER

(71) Applicant: SHIN-ETSU HANDOTAI CO., LTD., Tokyo (JP)

(72) Inventors: Keitarou Tsuchiya, Takasaki (JP); Kazunori Hagimoto, Takasaki (JP); Masaru Shinomiya, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 829 days.

(21) Appl. No.: 17/278,396

(22) PCT Filed: Sep. 6, 2019

(86) PCT No.: PCT/JP2019/035118
§ 371 (c)(1),
(2) Date: Mar. 22, 2021

(87) PCT Pub. No.: WO2020/066544
PCT Pub. Date: Apr. 2, 2020

(65) Prior Publication Data
US 2021/0358738 A1 Nov. 18, 2021

(30) Foreign Application Priority Data
Sep. 26, 2018 (JP) ................. 2018-180177

(51) Int. Cl.
*H01L 21/02* (2006.01)
(52) U.S. Cl.
CPC .. *H01L 21/02021* (2013.01); *H01L 21/02381* (2013.01); *H01L 21/0254* (2013.01)

(58) Field of Classification Search
CPC ......... H01L 21/02021; H01L 21/02381; H01L 21/0254
(Continued)

(56) References Cited

U.S. PATENT DOCUMENTS

| 2007/0105351 A1 | 5/2007 | Motoki et al. |
| 2008/0188078 A1 | 8/2008 | Iguchi et al. |

(Continued)

FOREIGN PATENT DOCUMENTS

| CN | 103503155 A | * 1/2014 | ........... H01L 29/045 |
| JP | S59-227117 A | 12/1984 | |

(Continued)

OTHER PUBLICATIONS

Mar. 23, 2021 International Preliminary Report on Patentability issued in International Patent Application No. PCT/JP2019/035118.
(Continued)

*Primary Examiner* — Igwe U Anya
(74) *Attorney, Agent, or Firm* — Oliff PLC

(57) ABSTRACT

A method for manufacturing an epitaxial wafer including the steps of: preparing a silicon-based substrate having a chamfered portion in a peripheral portion; forming an annular trench in the chamfered portion of the silicon-based substrate along an internal periphery of the chamfered portion; and performing an epitaxial growth on the silicon-based substrate having the trench formed. This provides a method for manufacturing an epitaxial wafer by which a crack generated in a peripheral chamfered portion can be suppressed from extending towards the center.

11 Claims, 2 Drawing Sheets (a) Preparing silicon-based substrate having chamfered portion in peripheral portion (b) Forming annular trench along internal periphery of chamfered portion (c) Epitaxial growth

(58) Field of Classification Search
USPC .......................................................... 257/622
See application file for complete search history.

(56) References Cited

U.S. PATENT DOCUMENTS

| | | | |
|---|---|---|---|
| 2011/0298063 A1* | 12/2011 | Mayer ................ | B81C 1/00269 438/51 |
| 2012/0153439 A1 | 6/2012 | Sugawara et al. | |
| 2013/0087807 A1* | 4/2013 | Ikuta ....................... | H01L 29/12 257/76 |
| 2013/0140567 A1* | 6/2013 | Kim .................. | H01L 21/02381 257/E21.473 |
| 2015/0028457 A1 | 1/2015 | Shikauchi et al. | |
| 2015/0279696 A1* | 10/2015 | Cohen ............... | H01L 21/02538 257/506 |
| 2016/0308041 A1* | 10/2016 | Then ........................ | H01L 21/84 |
| 2016/0365249 A1* | 12/2016 | Nakao .................. | H01L 21/0337 |
| 2018/0019115 A1* | 1/2018 | Fan ........................ | H01L 21/324 |
| 2018/0026096 A1 | 1/2018 | Jacob et al. | |

FOREIGN PATENT DOCUMENTS

| | | |
|---|---|---|
| JP | H04-073930 A | 3/1992 |
| JP | 2008-192663 A | 8/2008 |
| JP | 2011-119336 A | 6/2011 |
| JP | 2012-134294 A | 7/2012 |
| JP | 2012-171330 A | 9/2012 |
| JP | 2013-118384 A | 6/2013 |
| JP | 2013-171898 A | 9/2013 |
| KR | 10-2013-0062736 A | 6/2013 |
| WO | 2011/161975 A1 | 12/2011 |

OTHER PUBLICATIONS

Feb. 1, 2022 Office Action issued in Japanese Application No. 2018-180177.
Apr. 10, 2023 Office Action issued in Taiwanese Patent Application No. 11220325830.
Sep. 7, 2021 Office Action issued in Japanese Patent Application No. 2018-180177.
Nov. 19, 2019 International Search Report issued in International Patent Application No. PCT/JP2019/035118.
Oct. 3, 2023 Decision of Refusal issued in Taiwanese Patent Application No. 108133733.
Feb. 19, 2024 Office Action issued in Korean Patent Application No. 10-2021-7008121.
Jul. 3, 2024 Office Action issued in Chinese Patent Application No. 201980062141.7.

* cited by examiner

[FIG. 1]
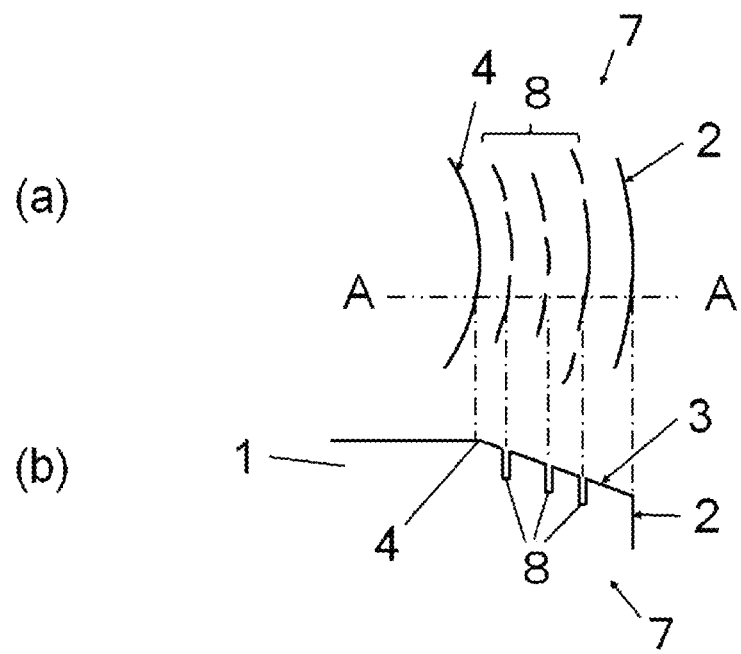
[FIG. 2]
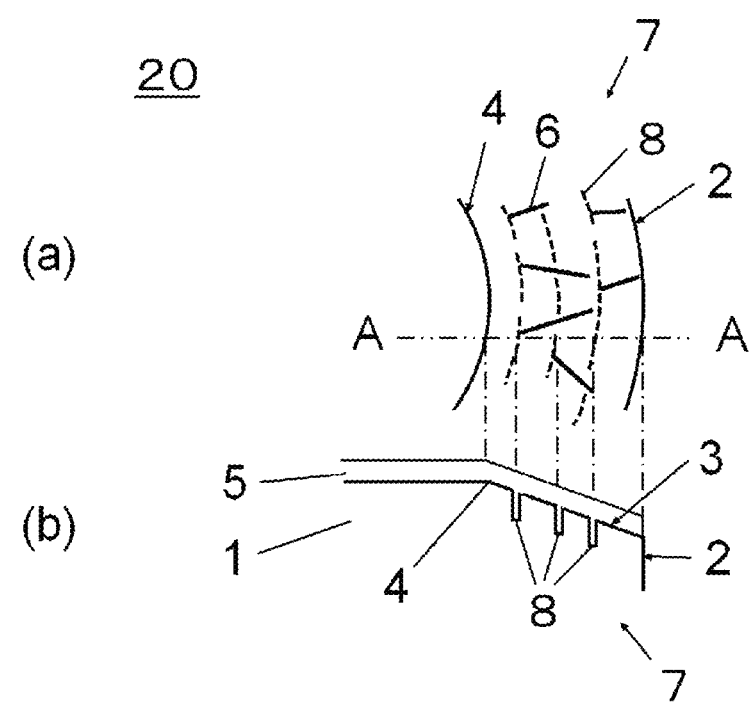

[FIG. 3]
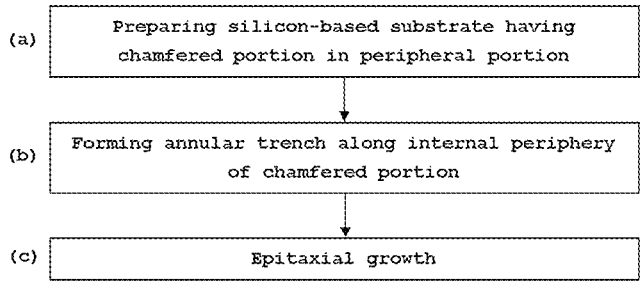
[FIG. 4]
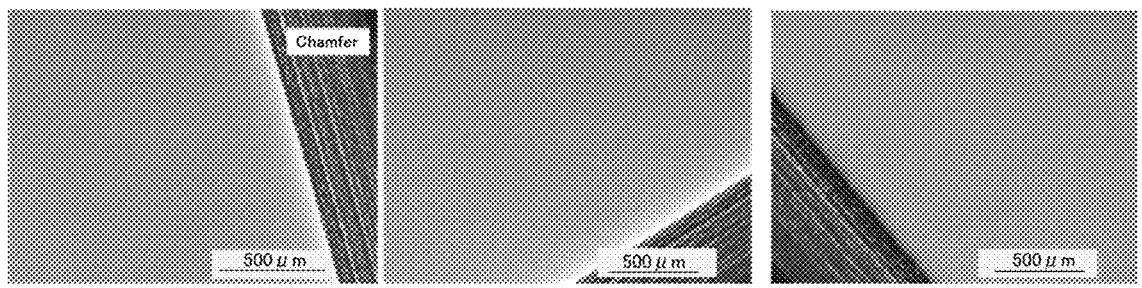
[FIG. 5]
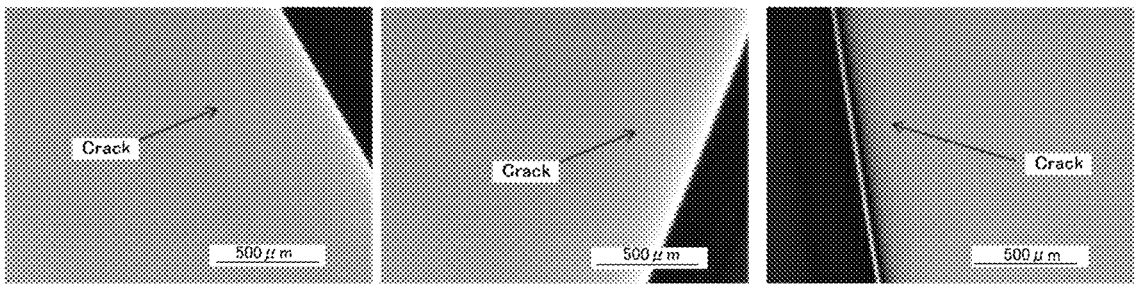
[FIG. 6]
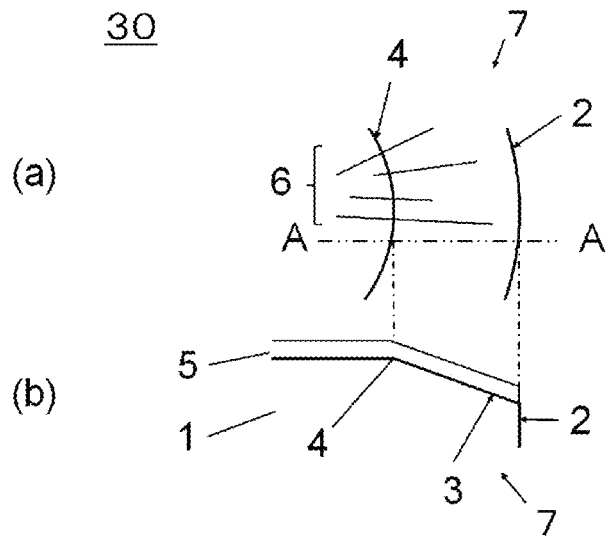

METHOD FOR MANUFACTURING EPITAXIAL WAFER, SILICON-BASED SUBSTRATE FOR EPITAXIAL GROWTH, AND EPITAXIAL WAFER

TECHNICAL FIELD

The present invention relates to: a method for manufacturing an epitaxial wafer having an epitaxial growth layer on a silicon-based substrate; a silicon-based substrate used for the method; and an epitaxial wafer.

BACKGROUND ART

To manufacture a semiconductor epitaxial wafer, epitaxial growth is performed on a surface of a silicon-based substrate (such as, for example, a silicon substrate and a silicon carbide substrate), or the like, using a commercially available epitaxial manufacturing apparatus so that a hetero/homoepitaxial wafer is manufactured.

A so-called GaN-on-Si substrate having a nitride semiconductor such as gallium nitride (GaN) grown on a silicon substrate is advantageous for enlarging the diameter and lowering the cost of a substrate, and is therefore expected to be applied in electronic devices and light-emitting diodes.

In an epitaxial wafer having an epitaxial growth layer composed of a nitride semiconductor disposed on a silicon-based substrate, a film thickness of the epitaxial growth layer becomes thicker in a peripheral portion, so that a crown (a projection which is higher than a main surface of the growth layer) is generated in the epitaxial growth layer.

In order to make warpage of the silicon-based substrate and stress of the epitaxial growth layer optimal at a wafer central portion which is used as a semiconductor device, conditions for a thickness, or the like, of each layer of the epitaxial growth layers are selected. Therefore, if the crown is generated, balance between stress applied to the epitaxial growth layer and warpage of the substrate is lost, which affects the epitaxial growth layer, and generates a honeycomb crack, or the like, in the epitaxial growth layer in the vicinity of the peripheral portion.

To prevent generation of such a crown, a method has been proposed of chamfering the peripheral portion of the silicon-based substrate and forming an epitaxial growth layer thereon (for example, Patent Document 1).

Furthermore, since a nitride semiconductor and a silicon substrate have a large difference in thermal expansion coefficient and a large difference in lattice constant, stress is generated between the epitaxial layer and the substrate, and a phenomenon of a crack extending sometimes occurs.

As a countermeasure for such a crack, Patent Document 2 proposes performing epitaxial growth in a state where a surrounding portion of the silicon-based substrate is covered with a ring.

CITATION LIST

Patent Literature

Patent Document 1: JP S59-227117 A
Patent Document 2: JP 2013-171898 A

SUMMARY OF INVENTION

Technical Problem

Even in an epitaxial wafer which is typically called a "crack-free" epitaxial wafer, there exists a crack in a region within approximately several millimeters from a peripheral portion due to generation of a crown.

There is concern that this crack may extend or may cause contamination of a manufacturing line by triggering delamination of an epitaxial growth layer during a manufacturing process of a device. Therefore, an epitaxial substrate which is completely free from cracks is desired.

The present inventors have investigated the source of the cracks of an epitaxial layer, and have found that a crack is generated in a chamfered portion of a substrate, and extends to the wafer surface.

This phenomenon will be explained with reference to FIG. 6. FIG. 6 shows a conceptual diagram of a conventional example of an epitaxial wafer. In FIG. 6, (a) shows a diagram of the vicinity of a peripheral portion of an epitaxial wafer 30 seen from above the surface of a wafer, and (b) shows a cross-sectional view in A-A of (a).

The epitaxial wafer 30 has an epitaxial layer 5 formed on the surface of a silicon-based substrate 1. A chamfered portion 3 is formed around the entire circumference of the silicon-based substrate 1 on the inner side of the edge portion 2 of the silicon-based substrate 1. Cracks 6 generated in a peripheral portion 7 pass over an internal periphery 4 of the chamfered portion 3 and extend towards the inside of the epitaxial wafer 30.

Generally, stress in the wafer surface is relaxed by interposing a buffer layer between the substrate and the epitaxial layer so that warpage of the epitaxial wafer becomes small, but as described above, in a GaN-on-Si substrate, cracks come in from the peripheral portion due to stress during growth or cooling. Cracks can be shortened by epitaxial growth technology, for example, the structure of a thin film and growth conditions. However, it can be conjectured that the chamfered portion in the outermost periphery of the wafer has a different plane orientation to that of the substrate, and therefore, a nitride semiconductor does not grow epitaxially and becomes amorphous. Hence, the stress cannot be relaxed, and the stress relaxation effect of the buffer layer is reduced.

In the technology for not performing an epitaxial growth or performing a thin epitaxial growth in the chamfered portion shown in Patent Document 2, it is necessary to cover the chamfered portion to suppress the epitaxial growth in the chamfered portion, handling during fabrication of an epitaxial wafer is difficult, and radial film thickness distribution has been degraded.

The present invention has been made to solve the above problems, and an object thereof is to provide: a method for manufacturing an epitaxial wafer by which a crack generated in a peripheral chamfered portion can be suppressed from extending towards the center; a silicon-based substrate for epitaxial growth used for the method; and an epitaxial wafer having cracks suppressed.

Solution to Problem

The present invention has been made to achieve the above object, and provides a method for manufacturing an epitaxial wafer comprising the steps of:
preparing a silicon-based substrate having a chamfered portion in a peripheral portion;
forming an annular trench in the chamfered portion of the silicon-based substrate along an internal periphery of the chamfered portion; and
performing an epitaxial growth on the silicon-based substrate having the trench formed.

According to such a method for manufacturing an epitaxial wafer, there is no risk of degrading the radial distribution of film thickness, a crack generated in a peripheral chamfered portion can be suppressed from extending towards the center, and an epitaxial wafer with few cracks in the wafer surface can be manufactured.

In this event, the method for manufacturing an epitaxial wafer can be a method for manufacturing an epitaxial wafer, wherein a plurality of the trench is formed concentrically.

In this manner, a crack generated in the peripheral chamfered portion can be more stably suppressed from extending towards the center.

In this event, the method for manufacturing an epitaxial wafer can be a method for manufacturing an epitaxial wafer, wherein the trench is formed by machining, polishing, or dry etching.

In this manner, trench processing of the chamfered portion by which a crack generated in the peripheral chamfered portion can be suppressed from extending towards the center can be performed simply and conveniently.

In this event, the method for manufacturing an epitaxial wafer can be a method for manufacturing an epitaxial wafer, wherein in a diametrical direction of the silicon-based substrate, 10 to 100/mm of the trench are formed.

In this manner, extension of a crack towards the center of the wafer can be stopped with more certainty, and an epitaxial wafer with few cracks in the wafer surface can be manufactured.

In this event, the method for manufacturing an epitaxial wafer can be a method for manufacturing an epitaxial wafer, wherein the trench is formed to have a width of 4 to 30 μm in a diametrical direction of the silicon-based substrate and an arithmetic average roughness Ra of 0.1 to 10 μm.

In this manner, extension of a crack towards the center of the wafer can be stopped with even more certainty, and an epitaxial wafer with fewer cracks in the wafer surface can be manufactured.

In this event, the method for manufacturing an epitaxial wafer can be a method for manufacturing an epitaxial wafer, wherein at least a gallium nitride (GaN) layer is grown in the step of performing the epitaxial growth.

In this manner, a nitride semiconductor epitaxial wafer with few cracks in the wafer surface can be manufactured.

Furthermore, the present invention provides a silicon-based substrate for epitaxial growth comprising:
a chamfered portion formed in a peripheral portion of the silicon-based substrate; and
an annular trench formed in the chamfered portion along an internal periphery of the chamfered portion.

Using such a silicon-based substrate for epitaxial growth, an epitaxial wafer with few cracks in the wafer surface can be manufactured when epitaxial growth is performed.

In this event, the silicon-based substrate for epitaxial growth can be a silicon-based substrate for epitaxial growth, wherein a plurality of the trench is formed concentrically.

In this manner, an epitaxial wafer with fewer cracks in the wafer surface can be manufactured when epitaxial growth is performed.

In this event, an epitaxial wafer comprising an epitaxial layer on the silicon-based substrate for epitaxial growth is possible.

In this manner, an epitaxial wafer with fewer cracks extended to the wafer surface is possible.

Advantageous Effects of Invention

As described above, according to the inventive method for manufacturing an epitaxial wafer, there is no risk of degrading the radial distribution of film thickness, a crack generated in a peripheral chamfered portion can be suppressed from extending towards the center, and an epitaxial wafer with few cracks in the wafer surface can be manufactured. In addition, using the inventive silicon-based substrate for epitaxial growth, an epitaxial wafer with few cracks in the wafer surface can be manufactured when epitaxial growth is performed.

BRIEF DESCRIPTION OF DRAWINGS

FIG. 1 shows a conceptual diagram of a peripheral portion of a silicon-based substrate according to the present invention.

FIG. 2 shows a conceptual diagram of a peripheral portion of an epitaxial wafer according to the present invention.

FIG. 3 shows a flow chart for manufacturing an epitaxial wafer according to the present invention.

FIG. 4 shows observation photographs of a peripheral portion of an epitaxial wafer in the Example.

FIG. 5 shows observation photographs of a peripheral portion of an epitaxial wafer in the Comparative Example.

FIG. 6 shows a conceptual diagram of a peripheral portion of an epitaxial wafer according to a conventional example.

DESCRIPTION OF EMBODIMENTS

Hereinafter, the present invention will be described in detail with reference to the drawings. However, the present invention is not limited thereto.

As described above, a method for manufacturing an epitaxial wafer by which a crack generated in a peripheral chamfered portion can be suppressed from extending towards the center has been desired.

The present inventors have earnestly studied the above problems, and found out that according to a method for manufacturing an epitaxial wafer including the steps of:
preparing a silicon-based substrate having a chamfered portion in a peripheral portion;
forming an annular trench in the chamfered portion of the silicon-based substrate along an internal periphery of the chamfered portion; and
performing an epitaxial growth on the silicon-based substrate having the trench formed, there is no risk of degrading the radial distribution of film thickness, a crack generated in a peripheral chamfered portion can be suppressed from extending towards the center, and an epitaxial wafer with few cracks in the wafer surface can be manufactured, and completed the present invention.

In addition, the present inventors have earnestly studied the above problems, and found out that using a silicon-based substrate for epitaxial growth including:
a chamfered portion formed in a peripheral portion of the silicon-based substrate; and
an annular trench formed in the chamfered portion along an internal periphery of the chamfered portion, an epitaxial wafer with few cracks in the wafer surface can be manufactured when epitaxial growth is performed, and completed the present invention.

FIG. 1 shows a conceptual diagram of a silicon-based substrate according to the present invention, and is an enlarged view of a chamfered portion in a peripheral portion of a silicon-based substrate for epitaxial growth according to the present invention. In FIG. 1, (a) shows a diagram of the vicinity of the peripheral portion 7 of the silicon-based substrate 1 seen from above the surface of the substrate, and (b) shows a cross-sectional view in A-A of (a). As shown in FIG. 1, a chamfered portion 3 is formed in the peripheral portion 7 of the silicon-based substrate 1 so as to slope from an edge portion 2 towards the surface of the silicon-based substrate 1. An annular trench 8 is formed in the chamfered portion 3 (slope) along an internal periphery 4 of the chamfered portion 3.

Note that examples of the silicon-based substrate 1 include a silicon (Si) substrate and a silicon carbide (SiC) substrate. The plane orientation (orientation) of the main surface of the substrate and the size of the substrate are not particularly limited, and can be appropriately selected according to the epitaxial growth layer. When epitaxial growth of a nitride semiconductor film such as a GaN-based film is performed, a silicon wafer with a plane orientation of <111> is possible, for example.

Here, the "annular trench" includes a case where the trench is broken along the way, besides a trench that is continuous along the entire internal periphery of the chamfered portion of the substrate.

FIG. 1 shows an example where a plurality of trenches are formed, but a single annular trench is also possible. In this case, a single trench appears in the cross-section of the chamfered portion. In this event, when the trench is formed to describe a single circle continuous along the entire internal periphery of the chamfered portion of the substrate, extension of a crack in the epitaxial layer can be suppressed with more certainty when the epitaxial growth is performed. Extension of a crack can also be suppressed when the trench is broken, and in this case, the trench can be formed simply and conveniently, and is therefore advantageous from aspects of workability and cost.

Furthermore, as shown in FIG. 1, extension of a crack can also be suppressed with more certainty when a plurality of the trench 8 is formed concentrically. In this case too, the trenches 8 may be formed to describe a single continuous circle, or a plurality of broken annular trenches 8 may be formed concentrically, but the trenches are preferably formed over the entire chamfered surface.

In addition, in a diametrical direction, 10 to 100/mm of the trench 8 in the chamfered portion 3 can be formed. When the number of the trenches 8 is in such a range, extension of a crack towards the center can be stopped with more certainty.

Furthermore, the width of the trench 8 in the chamfered portion 3 can be 4 to 30 μm, and the arithmetic average roughness Ra can be 0.1 to 10 μm. When the ranges are as described, extension of a crack towards the center can be stopped with even more certainty.

When an epitaxial layer is formed on the above-described silicon-based substrate 1, an epitaxial wafer with the extension of a crack towards the center stopped is possible.

FIG. 2 shows a conceptual diagram of an epitaxial wafer according to the present invention, and is an enlarged view of a chamfered portion 3 in a peripheral portion 7 of the epitaxial wafer. Explanation will be appropriately omitted regarding parts that are the same as FIG. 1.

In FIG. 2, (a) shows a diagram of the vicinity of the peripheral portion of the epitaxial wafer 20 seen from above the surface of the wafer, and (b) shows a cross-sectional view in A-A of (a). As shown in FIG. 2, cracks 6 that are generated in the chamfered portion 3 when the epitaxial layer is formed extend towards the inner part of the epitaxial wafer 20. However, extension of the cracks 6 can be stopped at the annular trench 8 part provided in the chamfered portion 3 of the silicon-based substrate 1. In this way, an epitaxial wafer 20 with few cracks in the wafer surface is possible.

Note that after growing the epitaxial layer 5, the trenches 8 provided in the silicon-based substrate 1 become covered with the epitaxial layer 5, and therefore, the trenches 8 have been shown with dotted lines in (a) of FIG. 2.

Next, the method for manufacturing an epitaxial wafer according to the present invention will be described with reference to FIGS. 1 to 3. FIG. 3 shows a flow chart of the method for manufacturing an epitaxial wafer according to the present invention.

Firstly, as shown in FIG. 3(a), a silicon-based substrate 1 having a chamfered portion 3 in a peripheral portion 7 is prepared.

Next, as shown in FIG. 3(b), a trench 8 is formed in the chamfered portion 3 of the silicon-based substrate 1 along an internal periphery 4 of the chamfered portion 3. Note that the chamfered portion 3 where the trench 8 is formed is a slope on the surface side where an epitaxial growth is performed.

The method for forming the trench 8 is not particularly limited as long as a groove can be formed in the chamfered portion 3. Formation by machining and polishing with a grinding wheel or the like is inexpensive and preferable. On the other hand, when a chemical method such as dry etching is employed, the shape of the trench can be controlled with precision.

Next, as shown in FIG. 3(c), an epitaxial growth is performed on the silicon-based substrate 1 having the trench 8 formed in the chamfered portion 3. The method for performing the epitaxial growth is not particularly limited. A chemical vapor deposition method (CVD) method such as a thermal CVD method, a plasma CVD method, a catalyst CVD method, and an MOVPE (MOCVD) method can be employed.

The composition, thickness, etc. of the epitaxial layer 5 are not particularly limited, but a nitride semiconductor is possible. The nitride semiconductor can be any one or more of AlN, AlGaN, and GaN.

The epitaxial layer 5 can be an epitaxial layer including: a buffer layer including, for example, a GaN layer, an AlN layer, or an AlGaN layer for relaxing stress due to difference in thermal expansion coefficient and difference in lattice constant; and a functional layer formed on the buffer layer. For example, it is possible to form an AlN layer, then grow a buffer layer by alternately laminating an AlGaN layer and a GaN layer, and form a GaN layer on the surface thereof, and the epitaxial layer can be grown with a thickness of about 3 to 10 μm in total.

When forming an epitaxial layer of a nitride semiconductor, the MOVPE method can be employed. For example, an epitaxial growth layer can be formed on a silicon-based substrate with the temperature set to 900 to 1350° C.

In a case where a trench 8 is not formed in the chamfered portion 3, as is conventional, cracks 6 generated in the chamfered portion 3 extend directly to the epitaxial layer 5 of the wafer surface (see FIG. 6). However, in the method for manufacturing an epitaxial wafer according to the present invention, as shown in FIG. 2, by forming a nitride semiconductor layer on the chamfered portion 3 with the trench 8 formed beforehand in order to stop the cracks 6 extending towards the center with the trench 8, a wafer with few cracks in the surface can be obtained.

EXAMPLE

Hereinafter, the present invention will be described in detail with reference to an Example. However, the present invention is not limited thereto.

Example

A silicon substrate having a chamfered portion formed in the periphery of the substrate, a diameter of 150 mm, a thickness of 1 mm, and a plane orientation of <111> was prepared. The chamfered portion of this silicon substrate was polished with a #800 grinding wheel to form, in the chamfered portion, concentric trenches with a roughness Ra of 0.350 μm and a trench width of 15 μm.

Using this silicon substrate, an AlN layer was formed, then a buffer layer was grown by alternately laminating an AlGaN layer and a GaN layer, and a GaN layer was further formed on the upper surface thereof by an MOCVD method. The total thickness of the epitaxial layer was set to 10 μm.

The peripheral portion of this epitaxial wafer was observed under a collimated light. FIG. 4 shows observation photographs of the vicinity of the peripheral portion of the epitaxial wafer according to the Example. The observation photographs are observation photographs taken in three different points. The parts that appear to be black and white stripes in FIG. 4 correspond to the parts in the chamfered portion of the substrate where the trenches were formed. As shown in FIG. 4, no large cracks extending to the wafer surface were observed in the region inwards of the chamfered portion in the observation under the collimated light. It was confirmed that extension of the cracks to the wafer surface was suppressed by the trenches formed in the chamfered portion of the silicon substrate.

In addition, in the epitaxial growth of this Example, a cover for the edge portion or the like as described in Patent Document 2 is not necessary, and therefore, there is no risk of the radial distribution of film thickness being degraded.

Comparative Example

An epitaxial growth was performed in the same manner as in the Example except that trenches were not formed in the chamfered portion of the silicon substrate and the chamfered portion remained mirror-polished (roughness Ra: 0.065 μm).

FIG. 5 shows observation photographs of the vicinity of the peripheral portion of the epitaxial wafer in the Comparative Example. As in the Example, the observation photographs are observation photographs taken in three different points. As shown in FIG. 5, there were no trenches in the chamfered portion and cracks were observed in nearly the entire circumference of the wafer in the observation under the collimated light, and it was confirmed that the cracks that were generated in the vicinity of the edge portion had extended towards the wafer surface.

As described above, according to the Example of the present invention, cracks generated in the vicinity of the edge portion were successfully suppressed from extending to the wafer surface without causing degradation of the radial film thickness distribution of the epitaxial layer.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing an epitaxial wafer comprising the steps of:
preparing a silicon-based substrate having a chamfered portion in a peripheral portion;
forming an annular trench in the chamfered portion of the silicon-based substrate along an internal periphery of the chamfered portion; and
performing an epitaxial growth on the silicon-based substrate having the trench formed,
wherein in a diametrical direction of the silicon-based substrate, 10 to 100/mm of the trench are formed.

2. The method for manufacturing an epitaxial wafer according to claim 1, wherein a plurality of the trench is formed concentrically.

3. The method for manufacturing an epitaxial wafer according to claim 1, wherein the trench is formed by machining, polishing, or dry etching.

4. The method for manufacturing an epitaxial wafer according to claim 2, wherein the trench is formed by machining, polishing, or dry etching.

5. The method for manufacturing an epitaxial wafer according to claim 1, wherein the trench is formed to have a width of 4 to 30 μm in a diametrical direction of the silicon-based substrate and an arithmetic average roughness Ra of 0.1 to 10 μm.

6. The method for manufacturing an epitaxial wafer according to claim 1, wherein at least a gallium nitride (GaN) layer is grown in the step of performing the epitaxial growth.

7. A silicon-based substrate for epitaxial growth comprising:
a chamfered portion formed in a peripheral portion of the silicon-based substrate; and
an annular trench formed in the chamfered portion along an internal periphery of the chamfered portion,
wherein in a diametrical direction of the silicon-based substrate, 10 to 100/mm of the trench are formed.

8. The silicon-based substrate for epitaxial growth according to claim 7, wherein a plurality of the trench is formed concentrically.

9. An epitaxial wafer comprising an epitaxial layer on the silicon-based substrate for epitaxial growth according to claim 7.

10. An epitaxial wafer comprising an epitaxial layer on the silicon-based substrate for epitaxial growth according to claim 8.

11. The silicon-based substrate for epitaxial growth according to claim 7,
wherein the trench is formed to have a width of 4 to 30 μm in a diametrical direction of the silicon-based substrate and an arithmetic average roughness Ra of 0.1 to 10 μm.

* * * * *